United States Patent [19]

Wolkstein et al.

[11] 4,243,951
[45] Jan. 6, 1981

[54] HIGH REPETITION RATE DRIVER CIRCUIT FOR MODULATION OF INJECTION LASERS

[75] Inventors: Herbert J. Wolkstein, Livingston; Brian R. Dornan, Bridgewater; Jitendra Goel, Kendall Park, all of N.J.

[73] Assignee: RCA Corporation, New York, N.Y.

[21] Appl. No.: 914,902

[22] Filed: Jun. 12, 1978

[51] Int. Cl.³ ............................................... H01S 3/13
[52] U.S. Cl. .......................... 331/94.5 H; 331/94.5 M; 331/94.5 S
[58] Field of Search .................... 331/94.5 M, 94.5 H; 307/296 R; 250/199

[56] References Cited

U.S. PATENT DOCUMENTS

| 3,925,735 | 12/1975 | Ozeki et al. | 331/94.5 H |
| 4,009,385 | 2/1979 | Sell | 250/199 |
| 4,027,179 | 5/1977 | Kawamoto | 307/296 R |

OTHER PUBLICATIONS

"Direct Modulation of D. H. GaA/As Lasers with GaAs M.E.S.F.E.T.S", Ostoich et al.; *Electronic Letters*; pp. 515 and 516, Oct. 16, 1975.

Primary Examiner—William L. Sikes
Assistant Examiner—Leon Scott, Jr.
Attorney, Agent, or Firm—Samuel Cohen; Joseph D. Lazar; Robert L. Troike

[57] ABSTRACT

An injection laser modulator comprises a self-biased field-effect transistor (FET) and an injection laser to provide a quiescent state during which lasing of the injection laser occurs in response to a high repetition rate signal of pulse coded modulation (PCM). The modulator is d.c. coupled to an input pulse source of PCM rendering it compatible with an input pulse referenced to ground and not being subject to voltage level shifting of the input pulse.

The modulator circuit in its preferred and alternate embodiments provides various arrangements for high impedance input and low impedance output matching. In addition, means are provided for adjusting the bias of the FET as well as the bias of the injection laser.

6 Claims, 8 Drawing Figures

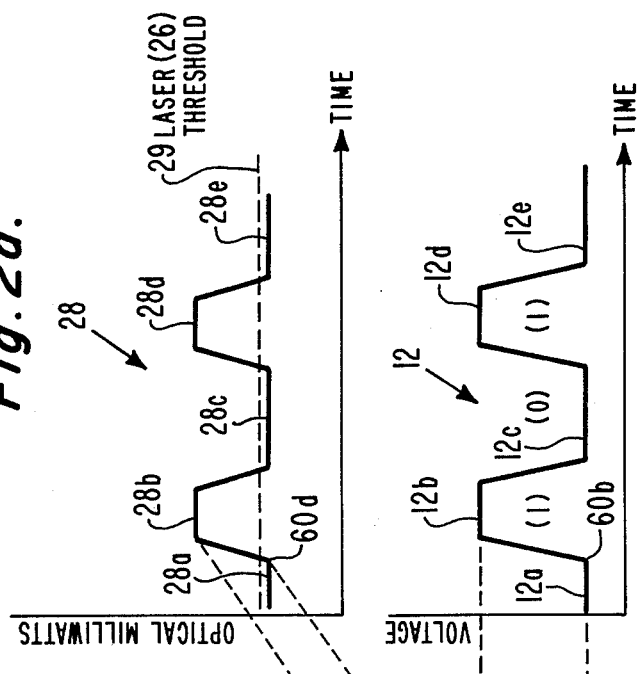

HIGH REPETITION RATE DRIVER CIRCUIT FOR MODULATION OF INJECTION LASERS

The Government has rights in this invention pursuant to Contract No. N000173-77-C-0136 awarded by the Navy.

BACKGROUND OF THE INVENTION

1. Field of the Invention

The present invention relates to a driver circuit for modulation of an injection laser at a high repetition rate.

2. Description of the Prior Art

Semiconductor lasers, also known as injection lasers, are used for various systems, such as laser recorders and fiber optics communications to provide a light source which is representative of digital information. Laser modulator driver circuits are used to transform the digital information, in the form of pulse coded modulation (PCM), to a light source from the injection laser whose intensity is representative of the received PCM.

Laser modulators capable of high repetition rates which employ bipolar devices and charging circuits are well known. Such a modulator is described in U.S. Pat. No. 4,027,179, entitled "High Repetition Rate Injection Laser Modulator," issued to Hirohisa Kawamoto, et al., May 31, 1977.

Driver circuits for laser modulators capable of high repetition rates employ techniques to minimize delay from the application of an electrical signal to the laser and the laser corresponding light output. The laser is arranged in a prebiased condition with a current which is near the laser threshold current, that is, the current at which the laser will initiate its lasing action. Application of an electrical signal to a laser in this prebiased condition improves the speed of response of the laser. Such a circuit is described in U.S. Pat. No. 4,009,385, entitled "Laser Control Circuit," issued to Darrell Dean Sell, Feb. 22, 1977.

It is also well known that the speed of response of a data input device, such as a bipolar transistor, is improved by prebiasing the transistor. A d.c. voltage is applied to the gate element of the bipolar transistor. In this bias arrangement, a capacitor or isolation diodes connected between the gate element and the source means that supplies digital signals for modulating the injection laser is normally provided for d.c. isolation between the input gate element and the source means. However, with capacitive coupling the d.c. voltage level of the input signal shifts as the repetition rate and pulse width of the input signal changes. Still further, the speed of response of the modulator decreases due to the corresponding charging time of the capacitor or isolation diode.

A circuit for modulating a diode laser with an FET is described in "Electronics Letter," dated Oct. 16, 1975, pages 517 and 518, in an article entitled "Direct Modulation of D.H. GaALAs Lasers with GaAs M.E.S.-F.E.T.S.". The circuit including an resistance-capacitance network utilizes a negative pulse of a return-to-zero pulse train to terminate conduction of a MESFET and cause lasing of a forward d.c. biased injection laser.

SUMMARY OF THE INVENTION

According to the invention, a control circuit responsive to an electrical modulated digital signal is provided for driving an injection laser. The control circuit prebiases the injection laser at a predetermined value near but below the lasing threshold value.

BRIEF DESCRIPTION OF THE DRAWING

FIG. 2a illustrates the circuit states of the laser modulator.

FIG. 2b illustrates the current of the field-effect transistor associated with the laser modulator states.

FIGS. 2c and 2d are voltage-time diagrams showing the relationship between an input gate signal and its corresponding output laser light source.

DESCRIPTION OF THE PREFERRED EMBODIMENT

Figure 1:
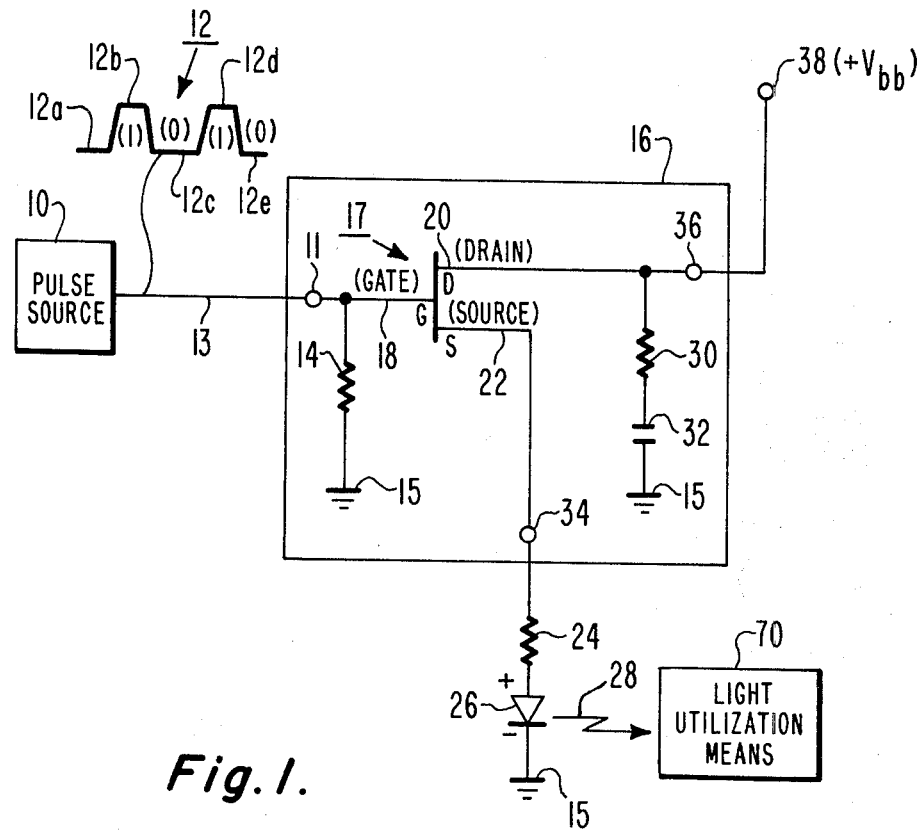
FIG. 1 is a block diagram of the preferred embodiment of the laser modulator.

Shown in FIG. 1 is a modulator-driver circuit 16 for modulating low impedance injection laser 26 with a high impedance pulse source 10. Pulse source 10 may be any digital transmission system having an output that contains digital information in a digital format. The digital information is conventionally in a digital format of logic "ones" and "zeros." The digital format is commonly referred to as pulse coded modulation (PCM). The logic "1" is typically manifested as the presence of a digital signal, and conversely the logic "0" is manifested as the absence of a digital signal.

Pulse source 10 supplies a series of digital pulses in the form of logic "0's" and logic "1's" shown as signal 12 comprising 12a, 12b, 12c, 12d, 12e, etc. Typically, the logic "0" is at ground potential and the logic "1" is at +0.6 volts. Modulator-driver circuit 16 responds to a logic "1" in the form of a positive voltage as represented by signal 12b and 12d. Digital information signals 12 from pulse source 10 are applied to modulator-driver circuit 16, which, as will be explained, causes lasing of injection laser 26 for the presence of a logic "1" and quiescence for the presence of a logic "0." The term, as known in the art, "lasing" refers to the condition whereby injection laser 26 produces a light output.

Signals 12 have a variable pulse repetition rate from 0 to approximately 500 MHz. Signals 12b, 12d, etc. may have a pulse width in the order of 1–10 nanoseconds at the 50% amplitude points, the rise time being in the order of 300 picoseconds. As will be explained, the speed of response of the modulator-driver circuit 16 is essentially limited only by the rise time of the pulses of pulse source 10.

The modulator-driver circuit 16 is connected to pulse source 10 via signal path 13, terminal 11, and a direct coupling d.c. network comprising resistor 14 which has one end connected to a circuit ground 15 and its other end connected to terminal 11 and a data input transistor 17, such as a field-effect transistor, via control gate electrode 18. The data input transistor 17 will be hereinafter referred to as FET 17. FET 17 has two additional electrodes, a source electrode 22 and a drain electrode 20. Field-effect transistor 17 is suitably a metal epitaxial semiconductor field-effect transistor (MESFET) type RCA MTC T450. Preferably the FET should be of the type that has a minimum of inter-electrode capacitance between the respective electrodes to increase its response time and minimize parasitic effects.

Figure 5:
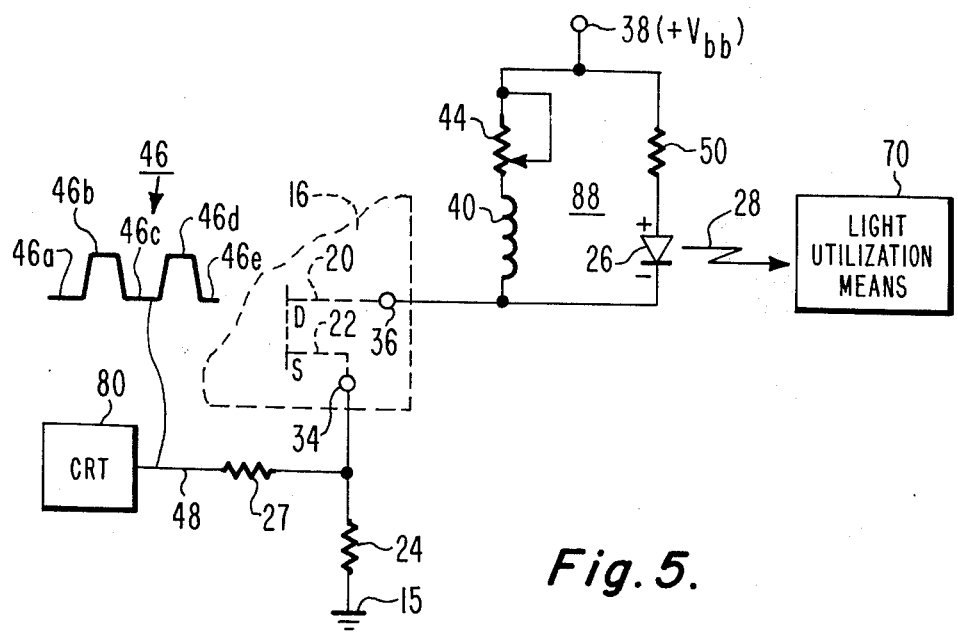
FIG. 5 is a block diagram of a still further alternate embodiment employing the gain parameter of a field-effect transistor, and also providing for adjustment of the prebias conditions and monitoring of the laser modulation.

FET 17 has its drain electrode 20 connected to a positive power supply 38 and also to a serially-connected resistor 30 and capacitor 32 to ground 15. Resistor 30 and capacitor 32 couple pulses present at drain electrode 20 to circuit ground 15. As will be explained, modulator-driver circuit 16 may be arranged in a source follower arrangement for input and output impedance matching (FIGS. 1 and 3) or as illustrated in FIGS. 4 and 5 in an arrangement that uses the gain parameter of FET 17.

The modulator-driver circuit 16 shown in FIG. 1 is arranged as a source follower having a grounded resistance load, consisting of resistor 24 and an injection laser 26, connected to source 22.

Injection laser 26 may be a conventional type such as RCA C30130. It should be understood that the speed of response of modulator-driver circuit 16 is improved by use of an injection laser that has a minimum of parasitic capacitances. This circuit is a source follower arrangement providing impedance matching of the high impedance pulse source 10 to the low impedance injection laser 26, noting that the laser cathode is grounded.

FET 17 is prebiased by d.c. voltages developed across resistor 24 and laser 26 to circuit ground 15 via $V_{bb}$ (38), drain 20 and source 22. Laser 26 is forwardly biased by the voltage drop across laser 26 caused by the quiescent current of FET 17 flowing through laser 26. In this self-biased condition, the voltage across laser 26 may be selected to provide a minimum of lasing to thereby not affect the light utilization means 70 but nevertheless be in a state to assure a rapid increase in light output in response to an input signal 12. The threshold value of the laser for the purpose of the present invention shall mean that value of voltage across the laser which will cause lasing and thereby a light output to which the utilization means will respond.

Resistor 24 while serving as a current limiter to limit the current of the FET 17 in its quiescent bias mode is selected preferably to match the resistance of the laser 26 in its dynamic state.

FET 17 in response to a logic "0" condition of signal 12 at control electrode 18 will not be cut off. Because of this non cut-off condition, a direct connection, that is, d.c. coupling, of FET 17 is enabled for connection to pulse source 10.

D.C. coupling pulse source 10 to prebiased FET 17 and foward biased injection laser 26 essentially eliminates time delay in achieving the threshold signal levels of the input signal 12, applied to gate electrode 18, and the corresponding lasing of injection laser 26. According to this invention, the fast response of driver circuit 16 is accomplished by prebiasing FET 17 and injection laser 26 such that the quiescent current is near but below the threshold value of injection laser 26 for lasing for thereby producing a light source output 28 (FIG. 1 and FIG. 2). The speed of response driver circuit 16 to an input signal, such as 12b, and corresponding lasing of injection laser 26 is essentially only limited by the characteristics of the signal 12b. The fast response of driver 16 provides an output signal for modulation of injection laser 26 that is essentially the same as input gate signal 12 with regard to rise and fall pulse times. Therefore, driver circuit 16 having a fast response time, produces an output pulse having essentially the same characteristics as the input pulse. The response time of driver circuit 16 will be discussed later.

Shown in FIG. 2a are two states of driver circuit 16, comprising the quiescent state 60, and the operating state 62. Quiescent state 60 represents the state of modulator driver circuit 16 in the quiescent prebiased condition. The prebias exists for no signal or signal 12 in its logic "0" condition. Application of a pulse, such as 12b, to control electrode 18 causes the driver circuit 16 to transition from its quiescent state 60 to its operating state 62 in a manner as will be discussed hereinafter.

State 60 represents the self-bias condition of FET 17 in its quiescent state near but below threshold condition of injection laser 26. In quiescent state 60, the quiescent current is flowing through FET 17 and injection laser 26 to circuit ground 15. The quiescent current establishes a self-bias voltage at terminal 34 (FIG. 1) expressed as follows:

$$V_{bias} = (I_Q) \cdot (R_{24} + R_{26}) \tag{1}$$

where
$I_Q$ = quiescent current of FET 17 and the current of injection laser 26 near the threshold value,
$R_{24}$ = resistance value of resistor 24, and
$R_{26}$ = quiescent resistance value of the internal resistance of injection laser 26.

The quiescent current $I_Q$ is selected for the threshold conditions of injection laser 26 and the voltage level of signals such as 12a.

The self-bias voltage at terminal 34 for FET 17 is dependent on the sum of the resistances of resistors $R_{24}$ and $R_{26}$ and the current through FET 17. The bias voltage of laser 26 is dependent on its resistance $R_{26}$ and the FET 17 current. Current limiting resistor $R_{24}$ is used to establish a quiescent self-bias voltage for FET 17 to limit its quiescent current. It should be understood that if it was desired to have a minimum self-bias voltage for FET 17 resistor $R_{24}$ would not be needed, the bias being established solely by the drop across diode 26.

Typically, the voltage drop across diode 26 is about 2.0 volts with a current of 100 ma. The bias voltage (at terminal 34) for FET 17 is typically 3 volts.

Reference is now made to FIG. 2b showing the characteristic currents of FET 17, particularly quiescent current $I_Q$, modulation current $I_m$, and the differential current $\Delta I$. Modulation current $I_m$ is the current that causes maximum lasing to produce a maximum light from injection laser 26. Current $\Delta I$ represents the total increase of current flow through FET 17 resulting from the application of a signal such as 12b following a signal such as 12a. Current $\Delta I$ is expressed as follows:

$$\Delta I = \Delta V_g \cdot g_m \tag{2}$$

where $\Delta V_g$ = voltage level incremental shift of the signal 12b.

A typical value for current $\Delta I$ is 18 ma with a $g_m$ of 30,000 micromhos for FET 17 and a $\Delta V_g$ of 0.6 volts.

To understand more fully, the overall operation of the driver circuit 16, reference will now be made to FIGS. 2a, 2b, 2c, and 2d. FIG. 2a shows the quiescent state 60 having a corresponding quiescent current $I_Q$ 60a shown in FIG. 2b and a corresponding logic "0" condition 60b of the applied signal 12 shown in FIG. 2c. Upon the transition from logic "0" to logic "1" (FIG. 2c) the current of FET 17 goes through a positive transition 60c (FIG. 2a) having a magnitude $\Delta I$ (FIG. 2b).

This is the transition of FET 17 from the quiescent current $I_Q$ to the modulating current $I_m$ to generate the laser output signal 28b (FIG. 2d). Prior to the application, the logic "1" signal 12b and the laser output 28a was at a value 60d (FIG. 2d) near but below its threshold condition represented by line 29 (FIG. 2d). The application of signal 12b causes FET 17 to supply current, $I_m$ to cause lasing of laser 26.

As seen in FIGS. 2c and 2d the increase of the leading edge of laser output signal 28b follows input signal 12b. Laser 26 starts generating light above threshold level 29 with very little time delay following the start of signal 12b. The light output intensity increases to a maximum as the voltage 28b rises to its maximum value. The elapsed time or delay from the start of the leading edge of signal 12b until the maximum value of output signal 28b is reached is preferably less than 100 picoseconds. This very fast response time is easily achieved since there is essentially no reactance (particularly capacitance) in the circuit which would otherwise effect a delay in the response of the laser output signal (28) to the input signal (12).

Optical output signal 28 is typically at an optical power level, in the order of 5–10 mw, for use by equipment such as a laser recorder or as the optical input to a fiber optics communication system. Such equipment is indicated as light utilization means 70 shown in FIG. 1.

Figure 3:
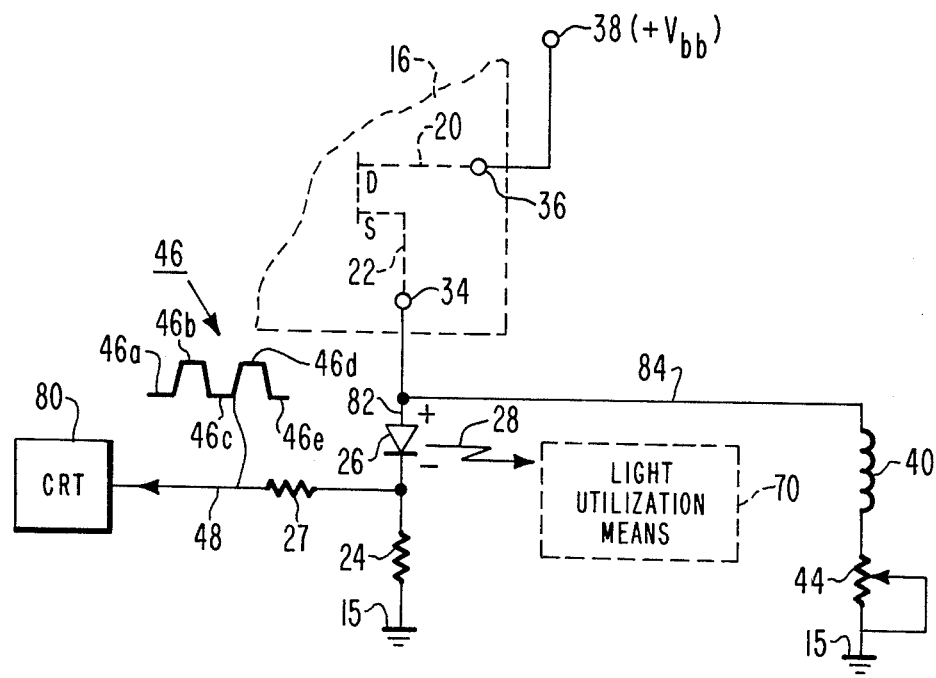
FIG. 3 is a block diagram of an alternate embodiment of the laser modulator.
Figure 4:
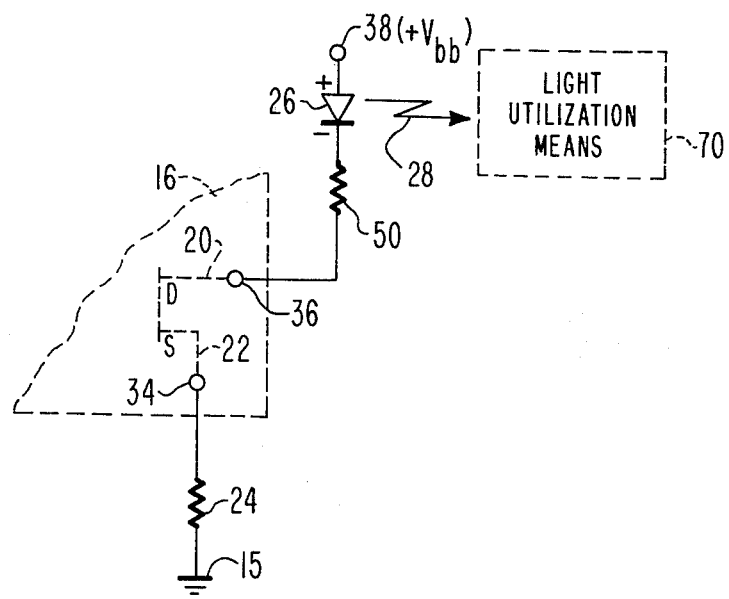
FIG. 4 is a block diagram of another embodiment employing the gain parameter of the field-effect transistor.

Shown in FIG. 3 is an alternate embodiment of the present invention for providing a means to adjust the bias of FET 17 as well as the near but below threshold bias value of injection laser 26. Monitor means 80, such as a CRT, is also provided to monitor the injection laser 26 modulation. The laser 26 is arranged to be not grounded. The anode of injection laser 26 is connected to FET source electrode 22 via terminal 34 of driver circuit 16. The anode of injection laser 26 is also connected to serially-connected inductor 40 and potentiometer 44 to ground 15. The cathode of injection laser 26 is connected to the junction of resistor 24 and resistor 27, resistor 24 being grounded and high impedance resistor 27 being coupled to CRT 80 via conductor 48. The load for source electrode 22 is thus essentially the resistance of the respective parallel paths comprising injection laser 26 and resistor 24 (path 82) and R.F. isolating inductor 40 and potentiometer 44 (path 84). Resistor 27 provides isolation between the injection laser 26 and monitor means 80. The current signal 46 carried by path 48 follows the input signal 12 and, of course, corresponds to the optical output signal 28. Thus, CRT 80 may be used to monitor the optical output of laser 26. Potentiometer 44 provides the means for adjusting the bias voltage of FET 17 for a particular quiescent current and also the means for adjusting a near but below threshold current for laser 26 different then the quiescent current of FET 17. The capability of separately setting the laser 26 threshold current to a desired level allows for laser diodes of different characteristics to be used with the modulation of the present invention. The quiescent current $I_Q$ of FET 17 is the total current flowing through parallel paths 82 and 84. The current flowing through each parallel path is dependent on the resistance value of each path.

For a given design of voltage source $V_{bb}$ (38), the impedances of the FET 17, the resistance of diode 26, and resistor 24, potentiometer 44 can be adjusted to provide a voltage at terminal 34 which will serve as a bias of the FET 17 and a source of bias for diode 26. The respective currents through the FET 17 and diode 26 will be different as determined by the respective resistances of the FET drain-to-source, and paths 82 and 84. The range of adjustment is limited by the voltage drop across diode 26. Typically, the voltage at terminal 34 is greater than 2.0 volts whereby an input signal 12 of 0.6 volts referenced to ground will provide a signal to operate diode 26, whose quiescent voltage drop is 2.0 volts.

Shown in FIG. 4 is a further embodiment in which the diode 26 is connected in the drain circuit of the FET. Resistor 24 now serving solely as the source bias resistor is connected to source electrode 22 of FET 17 via terminal 34 of driver circuit 16. Laser 26 and resistor 50 (matching the dynamic resistance of the laser) are connected to drain electrode 20 and connected to power supply 38 via the anode of injection laser 26. The connection of laser 26 directly to the drain electrode 22 provides a larger d.c. voltage in response to signals 12 for modulating laser 26 than can be generated by the source-follower arrangement in FIGS. 1 and 3. Thus, the bias voltage of the FET is no longer limited by the voltage drop across the diode 26 as occurs in the embodiments of FIGS. 1 and 3. The arrangement of FIG. 4 allows for utilizing diodes requiring larger operating voltages than would be useful in the embodiments of FIGS. 1 and 3.

A still further embodiment of the invention is shown in FIG. 5. This embodiment modifies the arrangement of FIG. 4 to provide adjustment of the bias of both the FET 17 as well as the near but below threshold bias for injection laser 26. Monitor means 80 is also provided if desired to monitor the modulation of injection laser 26 using the voltage drop across resistor 24. Laser 26 is serially connected to one end of resistor 50 and has its cathode connected to the drain electrode 20 via terminal 36 of driver circuit 16. The other end of resistor 50 is connected to power supply 38. Serially-connected laser 26 and resistor 50 is also connected in parallel with a serially-connected r.f. isolating inductor 40 and potentiometer 44. One end of potentiometer 44 is connected to power supply 38 while one end of inductor 40 is connected to drain electrode 20 via terminal 36. Resistor 24 is connected at one end to high impedance isolation resistor 27 and the other end to circuit ground 15. The common junction of resistors 24 and 27 is connected to the source electrode 22 via terminal 34 of driver circuit 16.

The d.c. bias level of FET 17 and the threshold value of injection laser 26 can be adjustably selected by potentiometer 44. The bias of FET 17 is determined by the voltage to ground 15 at source 22 (terminal 34). The foward bias of diode 26 is determined by the voltage drop across it. This diode voltage drop is determined by the respective circuit resistances of the parallel network 88 including the diode 26 and potentiometer 44 in series with FET 17 and resistor 24. As previously described the circuit may be designed to provide a range of adjustments that will allow the circuit to operate with a variety of different types of laser diodes (26).

The monitoring by monitor means 80 of the modulation of injection laser 26 is accomplished by connecting monitor means 80 to the source electrode 22 via resistor 27 and terminal 34. As previously explained, the near but below threshold value of injection laser 26 is manifested as a steady state condition of signal 46 present on signal path 48 and the lasing current of injection laser 26 is manifested as the pulse amplitude of the signal 46. The steady state and pulsed amplitude of signal 28 are representative of the quiescent current $I_Q$ and the modulation current $I_m$ of FET 17, respectively. The modulating operation of driver circuit 16 is as previously described.

It should now be appreciated that according to the present invention, a control circuit is provided for modulating a laser using direct connections to an input pulse source at zero or ground potential without being thereby subject to voltage level shifting, as occurs in capacitive coupled connections. Furthermore, the circuit providing for direct connections to the pulse source renders the laser independent of the repetition rate as well as the duty cycle of the incoming data signals.

The preferred and alternate embodiments described hereinabove provide various circuit arrangements of modulator driver circuits for ultra high speed modulation of injection laser 26 in the order of gigahertz rates. The ultimate speed of operation is essentially limited by the signal source 10.

What is claimed is:

1. An injection laser including a modulator for driving said injection laser in response to modulating signals, said modulator comprising:
    a current conducting device for controlling the flow of current through said laser, said device having input, output and control electrodes, said modulating signals being applied to said control electrode, and one of said input and output electrodes being coupled to said laser; and
    biasing means coupled to one of said input and output electrodes for biasing said current conducting device at a first current level and for biasing said laser at a predetermined value near but below the lasing threshold of said laser, said biasing means including:
    a first resistor in series with said laser; and
    a serially connected inductor and second resistor connected in parallel across said laser and said first resistor, said inductor being of a value to present an isolating impedance at the frequency of said modulating signals, and said current conducting device being responsive to said modulating signals at said control electrode for, in response to each signal, increasing the current through said laser to a value above its lasing threshold.

2. The combination of claim 1, wherein said current conducting device is a field effect transistor, said input, output and control electrodes comprising the source, drain and gate electrodes, respectively, of said transistor.

3. The combination of claim 2, wherein said second resistor is an adjustable resistor and wherein the series connected laser and first resistor are connected to said source electrode.

4. The combination according to claim 3, wherein said first resistor has a resistance that substantially matches the dynamic resistance of said laser.

5. The combination of claim 2, wherein said second resistor is an adjustable resistor and wherein said laser is connected to said drain electrode.

6. The combination of claim 5, wherein said first resistor has a resistance that substantially matches the dynamic resistance of said laser.

* * * * *